(12) United States Patent
Li et al.

(10) Patent No.: US 7,183,181 B2
(45) Date of Patent: Feb. 27, 2007

(54) DYNAMIC EDGE BEAD REMOVAL

(75) Inventors: Xiao Li, West Linn, OR (US); Roger Y. B. Young, Camas, WA (US); Bruce J. Whitefield, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 250 days.

(21) Appl. No.: 10/950,839

(22) Filed: Sep. 27, 2004

(65) Prior Publication Data

US 2006/0073703 A1    Apr. 6, 2006

(51) Int. Cl.
*H01L 21/20* (2006.01)
*H01L 21/36* (2006.01)

(52) U.S. Cl. .................. 438/503; 438/584; 438/758; 257/E21; 257/17

(58) Field of Classification Search ............... 438/503, 438/905, 510, 602, 603, 758, 766, 748, 584
See application file for complete search history.

(56) References Cited

U.S. PATENT DOCUMENTS

| 6,720,263 B2 * | 4/2004 | Olgado et al. ............. 438/690 |
| 6,818,066 B2 * | 11/2004 | Cheung ...................... 118/715 |
| 2004/0250839 A1 * | 12/2004 | Robertson et al. ........... 134/33 |

\* cited by examiner

*Primary Examiner*—David Nhu
(74) *Attorney, Agent, or Firm*—Luedeka, Neely & Graham, P.C.

(57) ABSTRACT

A method of removing an edge bead of a coated material on a substrate. The substrate is rotated, and a fluid that solvates the coated material is delivered. The delivery of the fluid is directed radially inward on the substrate at a rate of between about three millimeters per second and about twenty millimeters per second until a desired innermost fluid delivery position on the substrate is attained. Immediately upon attaining the desired innermost fluid delivery position on the substrate, the delivery of the fluid is directed radially outward off the substrate at a rate of more than zero millimeters per second and less than about four millimeters per second. The rotation of the substrate is ceased.

21 Claims, 5 Drawing Sheets

DYNAMIC EDGE BEAD REMOVAL

FIELD

This invention relates to the field of integrated circuit fabrication. More particularly, this invention relates to substrate processing.

BACKGROUND

As used herein, the term "integrated circuits" generally refers to monolithic semiconducting devices, such as those formed of group IV materials like silicon or germanium or mixtures thereof, or group III–V compounds such as gallium arsenide. The term "integrated circuits" includes all known configurations of such devices, such as memory and logic, and all designs of such devices, such as CMOS and bipolar.

Integrated circuits are typically formed through a series of photolithographic processes, where photoresist is applied across the surface of the substrate on which the integrated circuits are fabricated. The photoresist is exposed with a pattern that remains in the photoresist after it is developed. Processing is then accomplished in some manner through the voids that are formed in the patterned photoresist. For example, the exposed portions of the integrated circuits being fabricated can be etched, receive deposited layers, or be doped, such as with ion implantation.

An anti reflective coating is often placed on the substrate to improve various parameters, such as dimensional control, of the photolithographic process. This is accomplished by the antireflective coating reducing both the reflectance of the light off of the substrate and also the standing wave effects that are associated with such reflectance. Commonly used antireflective coatings are a class of non-photoactive organic materials.

The antireflective coating is typically spun onto the substrate in a manner that is similar to that used to apply photoresist. When this is done, the antireflective coating tends to build up on the edge of the substrate in a formation that is generally known as an edge bead. Because the edge bead can flake off and cause contamination and other problems with the integrated circuit fabrication process, it is generally removed using an organic solvent.

A typical edge bead removal process uses a swing arm dispenser to direct a spray of the edge bead removal solvent onto the edge of the substrate for a period of about five seconds. The typical process steps used are: (1) start the substrate rotation, (2) start dispensing the solvent through the spray nozzle, but not onto the substrate, (3) sweep the swing arm to move the spray nozzle and direct the solvent spray onto the edge of substrate, (4) Hold the spray nozzle at the desired edge bead removal set point for about five seconds, (5) move the spray nozzle back off of the substrate, stop dispensing the solvent through the spray nozzle, and (7) stop the substrate rotation. The nozzle is typically held so as to continuously direct the spray along a vector that is normal to the plane of the surface of the substrate.

Current edge bead removal processes are generally effective at removing the edge bead formation, but tend to result in a line of swollen and partially removed antireflective coating that circles around near the edge of the substrate along the interface between the solvent sprayed portion of the substrate and the portion of the substrate where the antireflective coating remains. This swollen ring of antireflective coating tends to remain even after the cleaning process is performed after the photolithography processing steps, because it is so thick. This circumferential residue of antireflective coating around the edge of the substrate creates what is known as the antireflective coating scar.

The scar tends to result in defects that reduce the yield of the integrated circuits on the substrate. The defects are caused when material such as an oxide or metal layer is deposited on top of the scar. In later steps, such as those involving thermal stress, the deposited material can flake off of the scar, because the thermal expansion coefficients are different, and the antireflective coating scar has generally poor adhesion properties. The scar can also cause defects by masking off material in subsequent etch processes, resulting in a stringer of unwanted material that can flake, peel, or short.

Some attempts have been made to remove the scar with extra processing, such as an edge etch to remove the films that are on top of the scar. However, this approach tends to create other issues, due to the cost of the extra processing steps. Most processes simply ignore the antireflective coating scar, and try to limit the extent of subsequent flaking defects by controlling later thermal processes, such as by using slower thermal ramps or lower temperatures. However, this approach is not completely effective, and tends to decrease the effectiveness of the processes that are modified in this manner.

What is needed, therefore, is a system that overcomes, at least in part, some of the problems described above.

SUMMARY

The above and other needs are met by a method of removing an edge bead of a coated material on a substrate. The substrate is rotated, and a fluid that solvates the coated material is delivered. The delivery of the fluid is directed radially inward on the substrate at a rate of between about three millimeters per second and about twenty millimeters per second until a desired innermost fluid delivery position on the substrate is attained. Immediately upon attaining the desired innermost fluid delivery position on the substrate, the delivery of the fluid is directed radially outward off the substrate at a rate of more than zero millimeters per second and less than about four millimeters per second. The rotation of the substrate is ceased.

In various embodiments, the substrate is an integrated circuit wafer. Preferably, the fluid is a liquid solvent. Delivery of the fluid is preferably accomplished by spraying the fluid onto the substrate. In some embodiments the coated material is an antireflective coating. In some embodiments, during all times that the fluid is delivered to the substrate, at least one of pulsed flow of the fluid, pulsed position of the fluid delivery, flow rate of the fluid, angle of delivery of the fluid, rotation speed of the substrate, and area of delivery of the fluid are continuously varied. Preferably, the desired innermost fluid delivery position of the substrate is radially inward on the substrate from the edge bead of the coated material.

According to another aspect of the invention there is described another method of removing an edge bead of a coated material on a substrate. The substrate is rotated, and a fluid that solvates the coated material is delivered. The delivery of the fluid is directed radially inward on the substrate at a rate of between about three millimeters per second and about twenty millimeters per second until a desired first fluid delivery position on the substrate is attained. The delivery of the fluid is then directed radially inward on the substrate at a rate of more than about twenty millimeters per second to a desired innermost fluid delivery position on the substrate. Immediately upon attaining the desired innermost fluid delivery position on the substrate, the delivery of the fluid is directed radially outward on the substrate at a rate of more than about twenty millimeters per second to the desired first fluid delivery position on the substrate. The delivery of the fluid is then directed radially outward off the substrate at a rate of more than zero millimeters per second and less than about four millimeters per second. The rotation of the substrate is then ceased.

According to yet another aspect of the invention there is described another method of removing an edge bead of a coated material on a substrate. The substrate is rotated, and a fluid that solvates the coated material is delivered. The delivery of the fluid is directed radially inward on the substrate until a desired innermost fluid delivery position on the substrate is attained. Immediately upon attaining the desired innermost fluid delivery position on the substrate, the delivery of the fluid is directed radially outward off the substrate. During all times that the fluid is delivered to the substrate, at least one of pulsed flow of the fluid, pulsed position of the fluid delivery, flow rate of the fluid, angle of delivery of the fluid, rotation speed of the substrate, and area of delivery of the fluid are continuously varied. The rotation of the substrate is then ceased.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
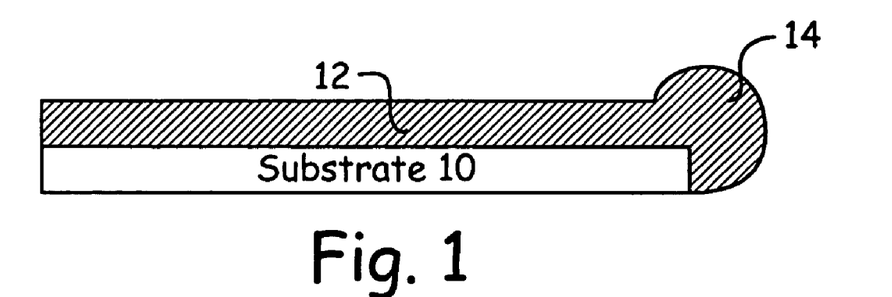
FIG. 1 is a cross sectional depiction of a substrate with a coated material that forms an edge bead.
Figure 2:
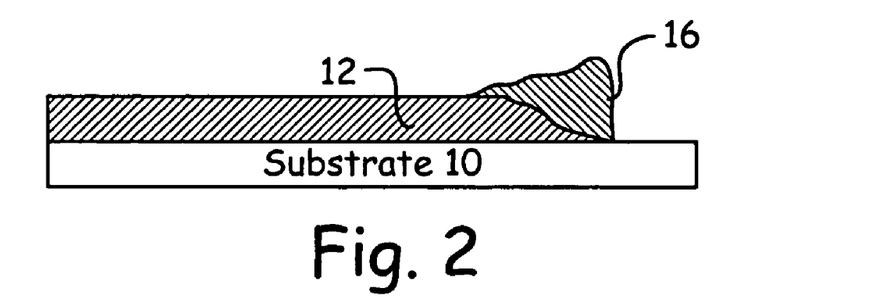
FIG. 2 is a cross sectional depiction of a substrate with a coated material, where the edge bead has been removed, but a swelling of the coated material remains.
Figure 3:
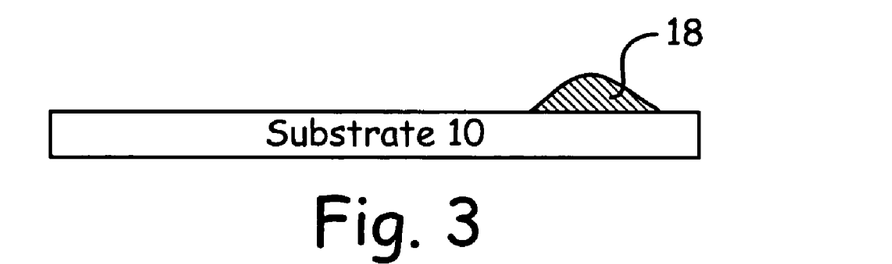
FIG. 3 is a cross sectional depiction of a substrate with a scar of the coated material remaining on the substrate.

With reference now to FIG. 1, there is depicted a substrate 10 that is coated with a material 12, such as an antireflective coating, which forms an edge bead 14. As described above, it is desirable to remove the edge bead 14. However, as depicted in FIG. 2, when the edge bead 14 is removed, such as with a traditional solvent spray process, a swelling 16 of the material 12 tends to occur. Even after processing and cleaning, the swelling 16 tends to result in a scar 18 that rings the substrate 10 near the outer edge of the substrate 10, as depicted in FIG. 3. Thus, the various embodiments of the present invention are designed to reduce the swelling 16 and thus the scar 18 that result from such an edge bead removal process.

Figure 4:
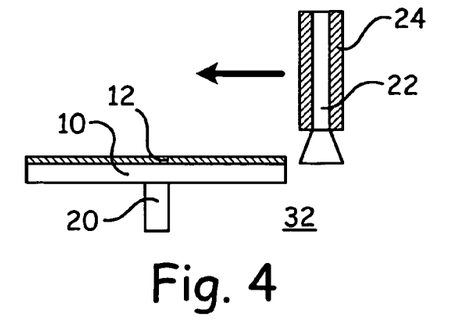
FIG. 4 depicts an initial position of an edge bead removal apparatus.
Figure 5A:
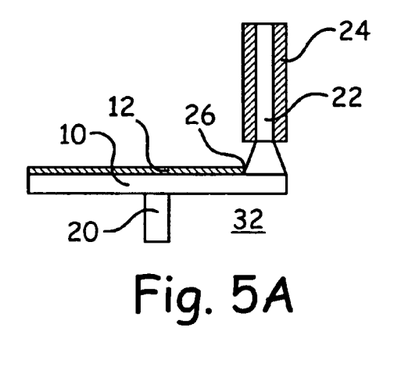
FIG. 5A depicts an intermediate position of an edge bead removal apparatus.
Figure 5B:
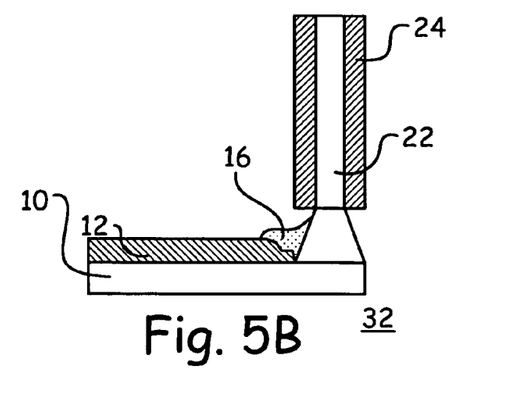
FIG. 5B provides an enlarged portion of FIG. 5A, depicting the swelling at the inner most point on the substrate.
Figure 6:
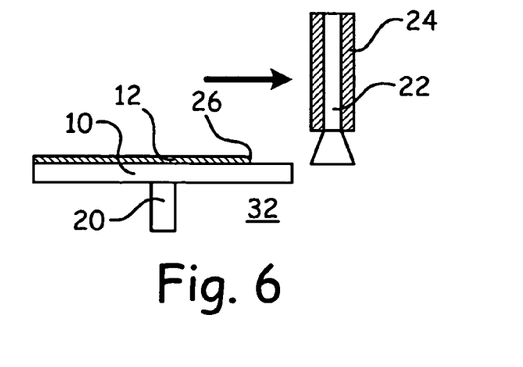
FIG. 6 depicts a final position of an edge bead removal apparatus.

An apparatus 32 for removing an edge bead 16 is depicted in FIGS. 4, 5, and 6. The substrate 10 with coating 12 is preferably mounted on a vacuum chuck 20 and rotated at a desired speed, as depicted in FIG. 4. A fluid 22, such as a liquid solvent, that solvates the coating 12 is preferably dispensed, such as through a spray nozzle 24. In the initial position of the apparatus 32, the fluid 22 is preferably dispensed in a manner that it does not contact the substrate 10 or the coating 12.

As depicted in FIG. 5A, the fluid 22 is preferably directed radially inward onto the substrate 10, such that it contacts the coating 12, and is brought to a position 26 that represents the desired innermost fluid delivery position 26 on the substrate 10. For example, the position 26 is preferably far enough in on the substrate 10 that all of the edge bead 14 is removed. In this embodiment, the direction in which the fluid 22 is dispensed is preferably controlled by sweeping the nozzle 24 through an arc or along a line that crosses the edge of the substrate 10, such as by mounting the nozzle 24 on a swing arm or translation stage. Alternately, the position of the substrate 10 could be adjusted to move under the spray nozzle 24, although this is a less preferred embodiment. In this manner, the nozzle 24 or other dispensing means in this embodiment is preferably always disposed so as to direct the fluid 22 toward the substrate 10 along a vector that is substantially normal to the surface of the substrate 10. FIG. 5B provides greater detail in regard to the swelling of the coating 12 that occurs at the remaining edge of the coating 12, when the nozzle 24 is in the inner most position 26 on the substrate 10.

As depicted in FIG. 6, after attaining the desired innermost fluid delivery position 26 on the substrate 10, the fluid is directed radially outward off of the substrate 10. The delivery of the fluid 10 is preferably stopped, and the rotation of the substrate 10 is also preferably stopped, after which the desired further processing on the substrate 10 is accomplished.

It is an aspect of the present invention that the length of time that the fluid 22 is delivered to the desired innermost fluid delivery position 26 be generally reduced, and preferably minimized. By reducing this length of time, the swollen portion 16 and the resultant scar 18 are also reduced in size, and most preferably eliminated altogether. Thus, the specific embodiments as described below illustrate some of the ways in which the innermost fluid delivery position 26—the remaining edge of the antireflective coating 12—receives a reduced degree of exposure to the fluid 22, and preferably as little exposure as possible. Thus, the following embodiments are by way of example only, and are not by way of constraint to the invention, the breadth of which is to be determined by the claims.

Figure 7:
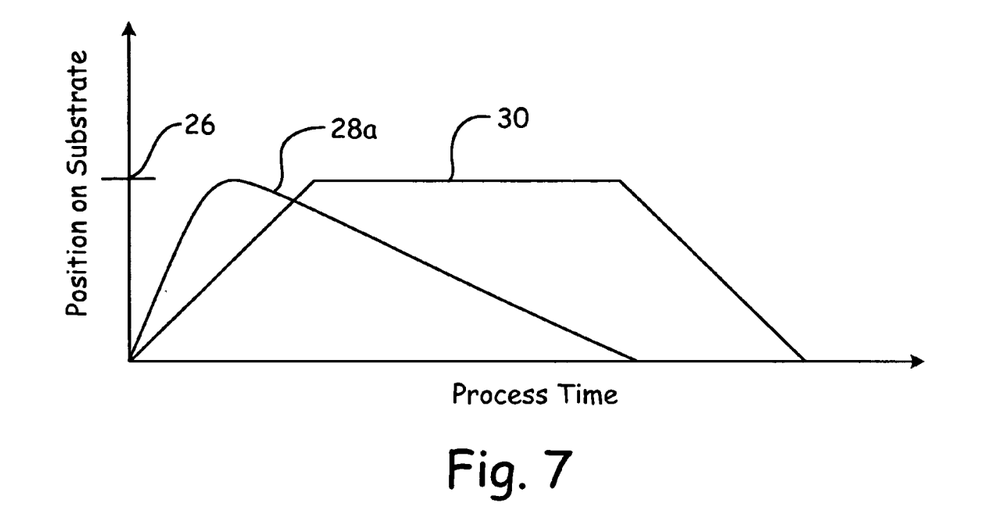
FIG. 7 depicts a graphical representation of a first edge bead removal process according to the present invention, as compared to a traditional edge bead removal process.

FIG. 7 depicts a graph of preferred operating parameters for the apparatus 32. The x axis of the graph represents advancing process time, and the y axis of the graph represents the position on the substrate 10 at which the fluid 22 is directed. Thus, position 26 is marked on the y axis, which position is the desired innermost position of the fluid 22 on the substrate 10. Line 28a represents a preferred operating condition for the present invention, and line 30 represents, by contrast, a prior art process.

As clearly depicted in FIG. 7, this embodiment 28a of the present invention brings the fluid 22 delivery to the innermost position 26 at a much faster rate than the prior art method 30. Also, this embodiment 28a also immediately directs the fluid 22 back off of the substrate 10 after the innermost position 26 has been attained. By contrast, the prior art method 30 holds the delivery of the fluid 22 at the innermost position 26 for a much greater length of time.

Finally, this embodiment 28a of the present invention directs the delivery of the fluid 22 away from the innermost position 26 and off of the substrate 10 at a much slower rate than it is brought in to the innermost position 26, and also at a much slower rate than that used to bring out the delivery of the fluid 22 in the prior art process 30. Thus, the rate at which the fluid 22 is brought inward, the length of time that the fluid 22 is held at the innermost point 26, and the rate at which the fluid 22 is brought outward are all different in this embodiment 28a from the prior art process 30. Thus, the present invention preferably uses a dynamic and asymmetric fluid 22 dispensing method.

In a most preferred embodiment, the fluid 22 delivery is brought inward at a rate of between about three millimeters per second and about twenty millimeters per second, and most preferably about twenty millimeters per second, and is brought outward at a rate that is less than about four millimeters per second, but which does not stop. However, these rates are adjusted to some degree depending upon the effective linear speed at the outer edge of the rotating substrate 10, which is effected by the rotational speed of the chuck 20 and the diameter of the substrate 10.

In any case the desired residence time at the inner most position is one that is sufficient to remove the film but not so long that the solvent permeates laterally into the film and causes excessive swelling. The exact residence time desired will be a property of the film being removed, the solvent applied and the type of substrate being processed.

Figure 8:
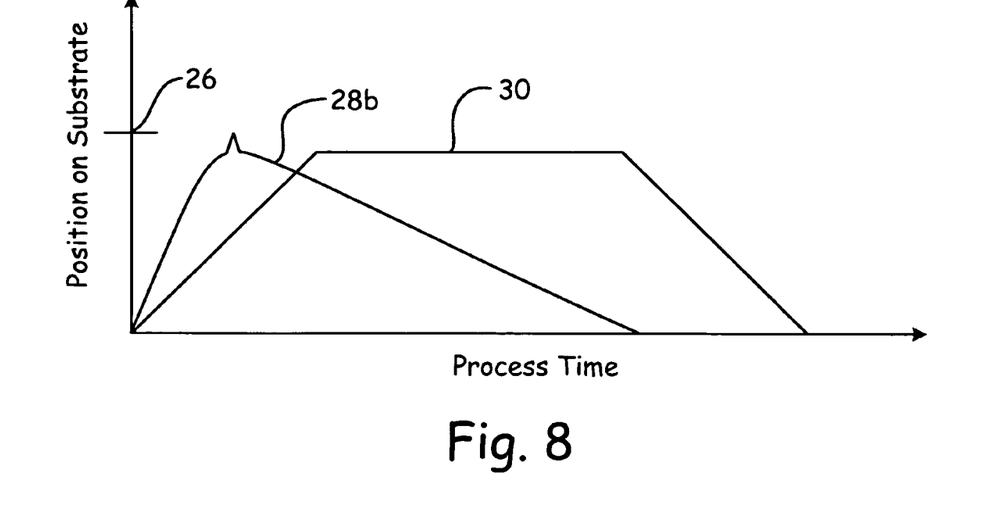
FIG. 8 depicts a graphical representation of a second edge bead removal process according to the present invention, as compared to a traditional edge bead removal process.

FIG. 8 depicts a graph of alternate operating parameters for the apparatus 32. The x axis of the graph again represents advancing process time, and the y axis of the graph again represents the position on the substrate 10 at which the fluid 22 is directed. Position 26 is marked on the y axis, as before. Line 28b represents another preferred operating condition for the present invention, and line 30 again represents the prior art process.

However, in this embodiment 28b, the innermost position 26 is a bit further in than before. In this embodiment 28b, the fluid 22 is directed to a first position, that preferably represents the prior art 30 innermost position, at which position the fluid 22 delivery is pulsed at a very rapid rate to the innermost position 26, and then brought quickly back out to the first position.

By operating the apparatus 32 in this manner, the amount of fluid 22 that contacts the coating 12 at the innermost position 26 is reduced. This tends to reduce the amount of fluid 22 that is soaked into the coating 12 at the innermost position 26, which tends to reduce the swelling of the coating 12 at that point, and reduces the scar 18 to a point where it can be cleaned off of the substrate 10, or doesn't form at all.

As depicted in FIG. 8, this embodiment 28b of the present invention again brings the fluid 22 delivery to the innermost position 26 at a much faster rate than the prior art method 30. And once again, this embodiment 28b also immediately directs the fluid 22 back off of the substrate 10 after the innermost position 26 has been attained.

Once again, this embodiment 28b of the present invention then directs the delivery of the fluid 22 away from the first position and off of the substrate 10 at a much slower rate than it is brought in to the first position, and also at a much slower rate than that used to bring out the delivery in the prior art process 30. Thus, as before, the rate at which the fluid 22 is brought inward, the length of time that the fluid 22 is held at the innermost point 26, and the rate at which the fluid 22 is brought outward are all different in this embodiment 28b from the prior art process 30. However, this embodiment 28b also has the additional difference of the pulsed entry of the fluid 22 to a position that is further into the interior of the substrate 10.

Figure 9:
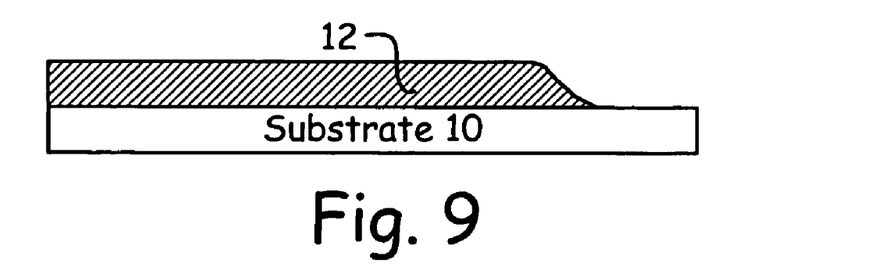
FIG. 9 is a cross sectional depiction of a substrate with a coated material that forms an edge bead, where the edge bead has been removed using a preferred embodiment of the present invention.

By pulsing the delivery of the fluid 22 just past the traditional innermost position 26, an amount of fluid 22 is delivered to the edge of the innermost position 26 that is sufficient to removed in substantial portion the coating material 12 that tends to swell and build up at the edge of the innermost position 26, leaving a coating 12 profile as generally depicted in FIG. 9. As can be seen in FIG. 9, the swelling 16 as depicted in FIG. 2 is replaced instead with a tapered profile of the coating 12, which is produced by pulsing the delivery of the fluid 12 past the typical innermost position 26 and onto the top of any swelling 16 that might form.

In other embodiments of the invention, other operational parameters of the apparatus 32 are continuously varied, such as continuously during the time that the fluid 22 contacts the substrate 10 and the coating 12. For example, the flow of the fluid 22 can be pulsed, the position of the delivery of the fluid 12 can be pulsed across the surface of the substrate 10, the flow rate of the fluid 22 can be varied, but not pulsed, the timing of the delivery of the fluid 12 can be varied, the substrate 10 can be spun at different speeds, such as varying or pulsed speeds, and the size of the dispenser nozzle 24 can be varied during the process. It is appreciated that various combinations of these parameter modifications are also comprehended by the present invention.

Figure 11:
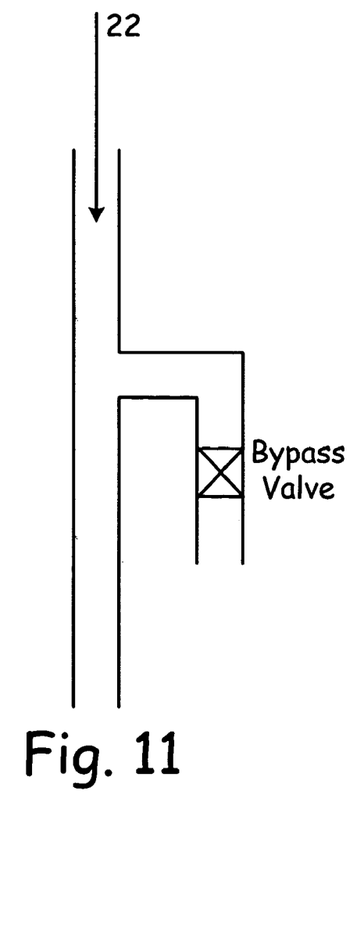
FIG. 11 depicts a first embodiment of an apparatus for pulsing the delivery of the solvating fluid.
Figure 12:
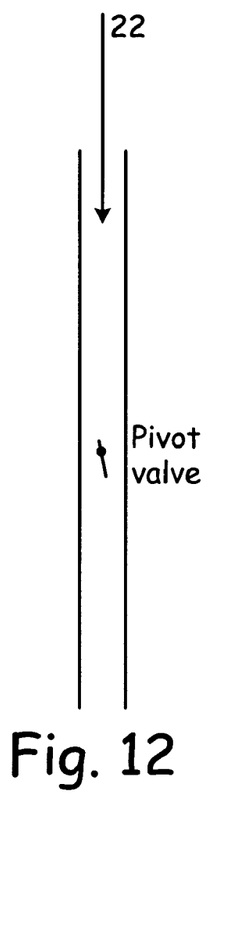
FIG. 12 depicts a second embodiment of an apparatus for pulsing the delivery of the solvating fluid.
Figure 13:
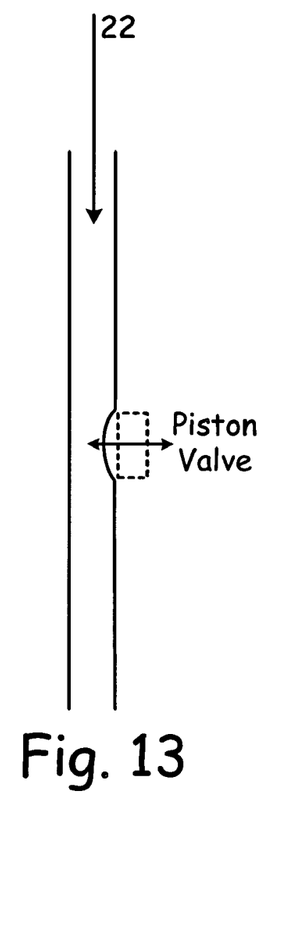
FIG. 13 depicts a third embodiment of an apparatus for pulsing the delivery of the solvating fluid.

FIGS. 11, 12, and 13 depict various embodiments by which the flow pulsing or variation of the fluid 22 as described above can be created. As depicted in FIG. 11, a by pass channel with a flow control valve can be used to pulse or vary the flow of the fluid 22 in one embodiment. In another embodiment, a pivot valve disposed within the flow channel of the fluid 22 can be used to pulse or vary the flow of the fluid 22, as depicted in FIG. 12. Further, a piston valve in the flow channel of the fluid 22 can be used to pulse or vary the flow the fluid 22, as depicted in FIG. 13. It is appreciated that other methods can also be used to pulse or vary the flow of the fluid 22.

Figure 10A:
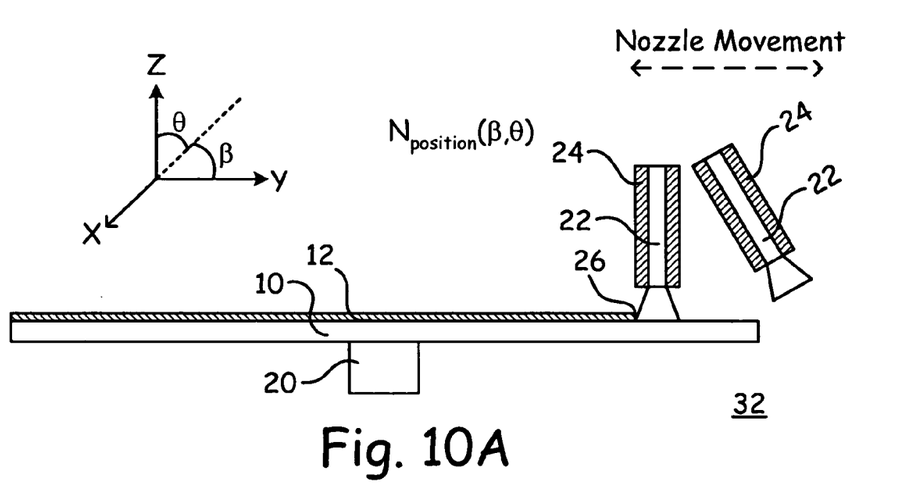
FIG. 10A depicts a third edge bead removal process according to the present invention.
Figure 10B:
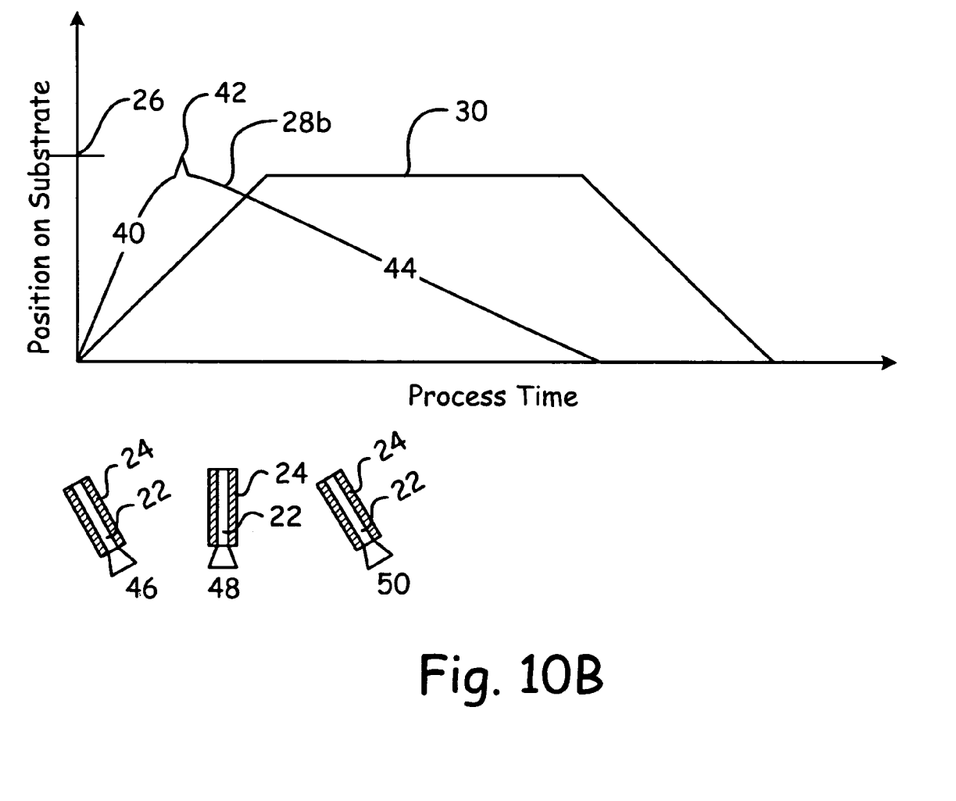
FIG. 10B depicts a graphical representation of the third edge bead removal process according to the present invention, as compared to a traditional edge bead removal process.

According to another embodiment of the invention, the fluid delivery means, such as the nozzle 24, can be angled such as depicted in FIG. 10A, to reduce the swelling 16 and the scar 18, thus using a variable angled fluid 22 dispense nozzle 24, as depicted in FIG. 10B. The rotation of the nozzle 24 is preferably function of Y-plan($\beta$) and Z-plan ($\theta$), $N_{position}(\beta,\theta)$. The features of the various embodiments of the present invention also tend to improve removal rate and removal precision.

The nozzle 24 rotation is preferably a function of its position from the edge of the substrate 10 so that the solvent stream is directed radially outwards from the substrate center, but at the innermost point of travel would be directed at a more vertical angle so as to minimize the length of time that the coating 12 is exposed to the fluid 22 at the innermost point of travel 26.

FIG. 10B depicts the nozzle 24 angle as a function of nozzle 24 position, as given in the chart. The initial portion 40 of the nozzle 24 travel is generally associated with a nozzle 24 angle 46, indicating that as the nozzle 24 sweeps radially inward toward the center of the substrate 10, the nozzle 24 is angled outward, so as to direct the spray, and any overspray, of the fluid 22 away from the center of the substrate 10 and those portions of the coating 12 that will remain on the substrate 10. As the nozzle 24 moves in toward the inner most position 26, the nozzle 24 angle 48 becomes more perpendicular to the surface of the substrate 10. At the pulse point 42, which preferably occurs right at the inner most position 26, the nozzle 24 is brought to an almost vertical position, or at least no more of an angle than ninety degrees. As the nozzle 24 sweeps back out off the edge of the substrate 10 along portion 44 of the curve, the nozzle angle 50 is again tilted outward and off of the substrate 10. In this manner, the coating 12 at the inner most position 26 of the substrate is exposed to the fluid 22 for as brief a time as possible, so as to reduce swelling of the coating 12 due to over exposure to the fluid 22.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of removing an edge bead of a coated material on a substrate, the method comprising the sequential steps of:
    commencing rotation of the substrate,
    commencing delivery of a fluid that solvates the coated material,
    directing the delivery of the fluid radially inward on the substrate at a rate of between about three millimeters per second and about twenty millimeters per second until a desired innermost fluid delivery position on the substrate is attained,
    immediately upon attaining the desired innermost fluid delivery position on the substrate, directing the delivery of the fluid radially outward off the substrate at a rate of more than zero millimeters per second and less than about four millimeters per second, and
    ceasing rotation of the substrate.

2. The method of claim 1, wherein the substrate is an integrated circuit wafer.

3. The method of claim 1, wherein the fluid is a liquid solvent.

4. The method of claim 1, wherein delivery of the fluid is accomplished by spraying the fluid onto the substrate.

5. The method of claim 1, wherein the coated material is an antireflective coating.

6. The method of claim 1, wherein during all times that the fluid is delivered to the substrate, continuously varying at least one of:
    pulsed flow of the fluid,
    pulsed position of the fluid delivery,
    flow rate of the fluid,
    angle of delivery of the fluid,
    rotation speed of the substrate, and
    area of delivery of the fluid.

7. The method of claim 1, wherein the desired innermost fluid delivery position of the substrate is radially inward on the substrate from the edge bead of the coated material.

8. A method of removing an edge bead of a coated material on a substrate, the method comprising the sequential steps of:
    commencing rotation of the substrate,
    commencing delivery of a fluid that solvates the coated material,
    directing the delivery of the fluid radially inward on the substrate at a rate of between about three millimeters per second and about twenty millimeters per second until a desired first fluid delivery position on the substrate is attained,
    directing the delivery of the fluid radially inward on the substrate at a rate of more than about twenty millimeters per second to a desired innermost fluid delivery position on the substrate,
    immediately upon attaining the desired innermost fluid delivery position on the substrate, directing the delivery of the fluid radially outward on the substrate at a rate of more than about twenty millimeters per second to the desired first fluid delivery position on the substrate,
    directing the delivery of the fluid radially outward off the substrate at a rate of more than zero millimeters per second and less than about four millimeters per second, and
    ceasing rotation of the substrate.

9. The method of claim 8, wherein the substrate is an integrated circuit wafer.

10. The method of claim 8, wherein the fluid is a liquid solvent.

11. The method of claim 8, wherein delivery of the fluid is accomplished by spraying the fluid onto the substrate.

12. The method of claim 8, wherein the coated material is an antireflective coating.

13. The method of claim 8, wherein during all times that the fluid is delivered to the substrate, continuously varying at least one of:
    pulsed flow of the fluid,
    pulsed position of the fluid delivery,
    flow rate of the fluid,
    angle of delivery of the fluid,
    rotation speed of the substrate, and
    area of delivery of the fluid.

14. The method of claim 8, wherein the desired innermost fluid delivery position of the substrate is radially inward on the substrate from the edge bead of the coated material.

15. A method of removing an edge bead of a coated material on a substrate, the method comprising the steps of:

commencing rotation of the substrate, commencing delivery of a fluid that solvates the coated material, directing the delivery of the fluid radially inward on the substrate until a desired innermost fluid delivery position on the substrate is attained, where an angle of the delivery of the fluid is directed radially outward on the substrate, immediately upon attaining the desired innermost fluid delivery position on the substrate, briefly pulsing the angle of the delivery of the fluid to a more perpendicular angle, and directing the delivery of the fluid radially outward off the substrate, where the angle of the delivery of the fluid is directed radially outward on the substrate.

16. The method of claim 15, wherein the substrate is an integrated circuit wafer.

17. The method of claim 15, wherein the fluid is a liquid solvent.

18. The method of claim 15, wherein delivery of the fluid is accomplished by spraying the fluid onto the substrate.

19. The method of claim 15, wherein the coated material is an antireflective coating.

20. The method of claim 15, wherein the desired innermost fluid delivery position of the substrate is radially inward on the substrate from the edge bead of the coated material.

21. A method of removing an edge bead of a coated material on a substrate, the method comprising the steps of:

commencing rotation of the substrate, commencing delivery of a fluid that solvates the coated material, directing the delivery of the fluid radially inward on the substrate at a first rate of speed until a desired innermost fluid delivery position on the substrate is attained, and immediately upon attaining the desired innermost fluid delivery position on the substrate, directing the delivery of the fluid radially outward off the substrate at a second rate of speed that is less than the first rate of speed.

* * * * *